United States Patent
Yamasaki et al.

(10) Patent No.: US 9,694,689 B2
(45) Date of Patent: Jul. 4, 2017

(54) POWER CONVERTING DEVICE FOR VEHICLE

(75) Inventors: Hisanori Yamasaki, Tokyo (JP); Tetsuo Sugahara, Tokyo (JP); Minoru Ikemoto, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 1512 days.

(21) Appl. No.: 13/322,253

(22) PCT Filed: Jun. 12, 2009

(86) PCT No.: PCT/JP2009/002668
§ 371 (c)(1),
(2), (4) Date: Nov. 23, 2011

(87) PCT Pub. No.: WO2010/143236
PCT Pub. Date: Dec. 16, 2010

(65) Prior Publication Data
US 2012/0063176 A1 Mar. 15, 2012

(51) Int. Cl.
*H05K 5/04* (2006.01)
*B60L 9/16* (2006.01)
*B60L 15/00* (2006.01)

(52) U.S. Cl.
CPC .............. *B60L 9/16* (2013.01); *B60L 15/007* (2013.01); *B60L 2200/26* (2013.01);
(Continued)

(58) Field of Classification Search
CPC ..... B60L 15/007; B60L 2200/26; H05K 5/04; H05K 13/0015; H02M 5/40
(Continued)

(56) References Cited

U.S. PATENT DOCUMENTS 5,687,066 A * 11/1997 Cook, II ............. H02M 3/3372
363/89
6,665,195 B1 12/2003 Drabon et al.
(Continued)

FOREIGN PATENT DOCUMENTS

CN 1313205 A 9/2001
CN 101232269 A 7/2008
(Continued)

OTHER PUBLICATIONS

Office Action issued on Mar. 14, 2014, by the Mexican Patent Office in corresponding Mexican Patent Application No. MX/a/2011/013329 and an English translation of the Office Action. (6 pages).
(Continued)

*Primary Examiner* — Nguyen Tran
*Assistant Examiner* — Jye-June Lee
(74) *Attorney, Agent, or Firm* — Buchanan Ingersoll & Rooney PC

(57) ABSTRACT

A control device for a vehicle, the control device including, in a housing that is installed under a floor of the vehicle: a power converter configured of a semiconductor switching circuit; a control unit that controls the output of the power converter so as to supply a required load to a power; a wiring that is connected to the power converter; a voltage detector that detects a voltage applied to the wiring and outputs the detected voltage to the control unit; and a shielding unit that shields radiation noise from the wiring to the voltage detector, wherein the control unit is disposed on a first side of the housing along a traveling direction of the vehicle, the power converter is disposed on a second side of the housing along the traveling direction of the vehicle and the voltage detector is disposed between the power converter and the control unit.

10 Claims, 8 Drawing Sheets

(52) U.S. Cl.
CPC . *B60L 2270/147* (2013.01); *H01L 2924/0002* (2013.01); *H05K 5/04* (2013.01); *Y02T 10/645* (2013.01)

(58) Field of Classification Search
USPC .............................. 363/34; 307/9.1; 318/17
See application file for complete search history.

(56) References Cited

U.S. PATENT DOCUMENTS

| | | | |
|---|---|---|---|
| 2001/0030881 A1* | 10/2001 | Yamaguchi | H02M 7/003 363/124 |
| 2008/0179999 A1* | 7/2008 | Nakazawa | B60L 9/005 310/68 D |
| 2008/0236964 A1 | 10/2008 | Kikuchi et al. | |
| 2009/0101419 A1 | 4/2009 | Okayama et al. | |
| 2009/0240384 A1* | 9/2009 | Ikemoto | B60L 1/003 307/9.1 |

FOREIGN PATENT DOCUMENTS

| | | |
|---|---|---|
| CN | 101454172 A | 6/2009 |
| EP | 1 975 447 A1 | 10/2008 |
| EP | 2020332 A1 | 4/2009 |
| JP | 63-283401 A | 11/1988 |
| JP | 1-135798 U | 9/1989 |
| JP | 8-238950 A | 9/1996 |
| JP | 1996-238950 * | 9/1996 |
| JP | 9-037414 A | 2/1997 |
| JP | 2009-096318 A | 5/2009 |
| WO | 03/088728 A1 | 10/2003 |

OTHER PUBLICATIONS

Office Action (Notice on the 2nd Office Action) issued on Sep. 24, 2014, by the State Intellectual Property Office of the People's Republic of China in corresponding Chinese Patent Application No. 200980159982.6, and an English Translation of the Office Action. (13 pages).

Office Action (Patent Examination Report No. 2) issued on Nov. 4, 2014, by the Australian Patent Office in corresponding Australian Patent Application No. 2009347792. (6 pages).

Extended European Search Report Dated Oct. 1, 2013, issued by the European Patent Office in corresponding European Patent Application No. 09845761.7 (6 pgs.).

International Search Report (PCT/ISA/210) issued on Sep. 1, 2009, by Japanese Patent Office as the International Searching Authority for International Application No. PCT/JP2009/002668.

Written Opinion (PCT/ISA/237) issued on Sep. 1, 2009, by Japanese Patent Office as the International Searching Authority for International Application No. PCT/JP2009/002668 (in Japanese).

* cited by examiner

POWER CONVERTING DEVICE FOR VEHICLE

TECHNICAL FIELD

The present invention relates to a power converting device for a vehicle, which employs a power semiconductor element, and particularly, which is disposed under a floor of a railway vehicle.

BACKGROUND ART

A power converting device for a vehicle includes power converting units which employ power semiconductor elements such as a so-called converter and inverter, a filter condenser and a control unit, and various types of control power supplies and sensors therefor. Equipments are disposed highly densely within a power converting device of, particularly, a high-speed railway vehicle (refer to Patent Document 1).

RELATED ART DOCUMENT

Patent Document

Patent Document 1: JP-A-2009-96318

SUMMARY OF THE INVENTION

Problem that the Invention is to Solve

In particular, in a power converting device for a railway vehicle, higher-speed and higher capacity is achieved. On the other hand, a power converting device is installed in a limited space under a floor of a vehicle, which demands a smaller power converting device. In addition, there is a problem to be solved that maintenance and inspection work has to be carried out easily while highly densely disposing the equipments in an interior of such a power converting device for a vehicle.

Accordingly, an object of the invention is to provide a power converting device for a vehicle, which facilitates the execution of maintenance and inspection work and meets the demand for a smaller power converting device for a vehicle.

Means for Solving the Problem

According to an aspect of the invention, there is provided a control device for a vehicle, the control device including, in a housing that is installed under a floor of the vehicle: a power converter configured of a semiconductor switching circuit; a control unit that controls the output of the power converter so as to supply a required load to a power; a wiring that is connected to the power converter; a voltage detector that detects a voltage applied to the wiring and outputs the detected voltage to the control unit; and a shielding unit that shields radiation noise from the wiring to the voltage detector, wherein the control unit is disposed on a first side of the housing along a traveling direction of the vehicle, the power converter is disposed on a second side of the housing along the traveling direction of the vehicle and the voltage detector is disposed between the power converter and the control unit.

According to another aspect of the invention, there is provided a control device for a vehicle, the control device including: a housing installed under a floor of the vehicle; a power converter including a semiconductor switching circuit; a control unit that controls the output of the power converter; a wiring that is connected to the power converter; and a voltage detector that detects a voltage applied to the wiring and outputs the detected voltage to the control unit, wherein the power converter, the control unit, the wiring and the voltage detector are provided to the housing, and wherein the control unit is disposed on a first side of the housing, the power converter is disposed on a second side of the housing that faces the first side of the housing, and the voltage detector is disposed between the power converter and the control unit.

Advantage of the Invention

According to the power converting device for a vehicle of the invention, by disposing equipment which needs frequent maintenance and inspection work on lateral sides of an interior of the power converting device, the power converting device for a vehicle, which is small in size and which facilitates the maintenance and inspection work, can be provided.

DESCRIPTION OF REFERENCE NUMERAL

1 Power converting system; 2 Converter unit; 3 Inverter unit; 4 Contactor unit; 5 Control unit; 6 Direct current link unit wiring; 7 Motor wiring; 8 Alternating current input wiring; 9, 9a, 9b Shielding unit; 10, 10a, 10b Voltage detector; 11 Box frame support beam; 13a to 13e Access hole; 20 Alternating current overhead wire; 21 Transformer; 22 Electric motor; 30 Direct current overhead wire; 31 Contactor unit; 32 Input filter reactor; 33 Input filter condenser unit; 34 Direct current bus wiring; 40, 40a, 40b, Filter condenser; 42 Converter current detector; 43, 43a, 43b Inverter current detector; 44 Alternating current voltage detector.

MODE FOR CARRYING OUT THE INVENTION

Hereinafter, the invention will be described in detail based on the drawings showing embodiments thereof.

Embodiment 1

Figure 1:
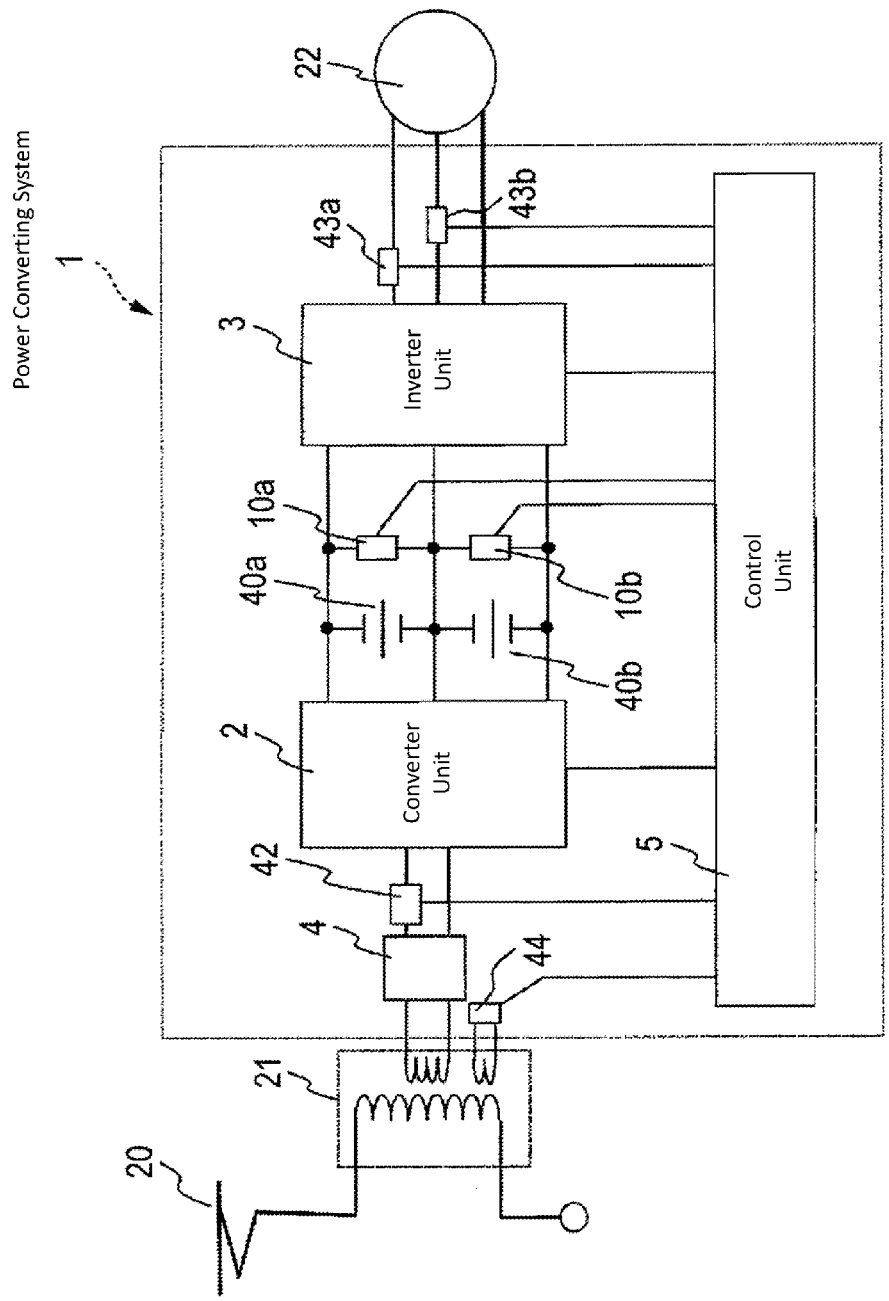
FIG. 1 is a circuit diagram of a power converting device for a vehicle according to embodiment 1 of the invention.

FIG. 1 is a circuit diagram of a power converting device for a vehicle according to embodiment 1 of the invention. This embodiment describes an electric vehicle with a three-level inverter/converter system, which runs an alternating current feeding section. In the electric vehicle, an alternating current voltage which is obtained from an alternating current overhead wire 20 via a pantograph is once inputted into a transformer 21 for transformation to a voltage suitable for input into a power converting device 1. The voltage which is so transformed is inputted into a converter unit 2, which is a power converter configured of a semiconductor switching circuit, via a contactor unit 4. A contactor which electrically separates the converter unit 2 from the transformer 21 is inserted into the contactor unit 4, and this contactor is opened when the power converting device is not in operation or the power converting device is separated from an alternating current power supply due to the occurrence of an abnormality.

In the converter unit 2, the alternating current input is converted into an intermediate direct current voltage, which is then outputted to filter condensers 40 (40a, 40b). In the case of a three-level converter, the intermediate direct current voltage has three potentials and is separated and smoothed by the two filter condensers 40a, 40b. The intermediate direct current voltage is inputted into an inverter unit 3, which is a power converter made up of a semiconductor switching circuit, and this intermediate direct current voltage is converted into a three-phase alternating current voltage which is variable in voltage and variable in frequency. The three-phase alternating current voltage is outputted to the electric motor 22, whereby the electric motor 22 is driven.

Next, a power converting operation at the converter unit 2 will be described. Current information obtained by a converter current detector 42 provided on an input line of the converter unit 2 and voltage information obtained by an alternating current voltage detector 44 connected to one of winding outputs of the transformer 21 are inputted into the control unit 5. Similarly, voltage information obtained by voltage detectors 10 (10a, 10b), which are connected between terminals of the filter condensers 40a, 40b to which the intermediate direct current, is applied is also inputted into the control unit 5. A converter gate signal calculated based on these pieces of information is outputted to the converter unit 2, whereby the power converting operation from the alternating current voltage to the intermediate direct current is controlled.

On the other hand, a power converting operation at the inverter unit 3 is executed as follows. Current information obtained by inverter current detectors 43a, 43b which are provided at a three-phase alternating current output of the inverter unit 3, voltage information of an intermediate direct current portion obtained by the voltage detectors 10a, 10b and an inverter gate signal calculated based on a torque command (not shown) which is given from a driver in a driver seat of the vehicle are outputted to the inverter unit 3, whereby the power converting operation from the intermediate direct current to the alternating current voltage, which is variable in voltage and variable in frequency, is controlled.

As has been described heretofore, various types of equipments are installed in the power converting device 1, and the capacities of the equipments are getting larger, while the equipments need to be installed in a limited space under the floor of the vehicle. An equipment arrangement according to this embodiment, which realizes a reduction in size while taking the handy maintenance into consideration, will be described by use of FIG. 2.

Figure 2:
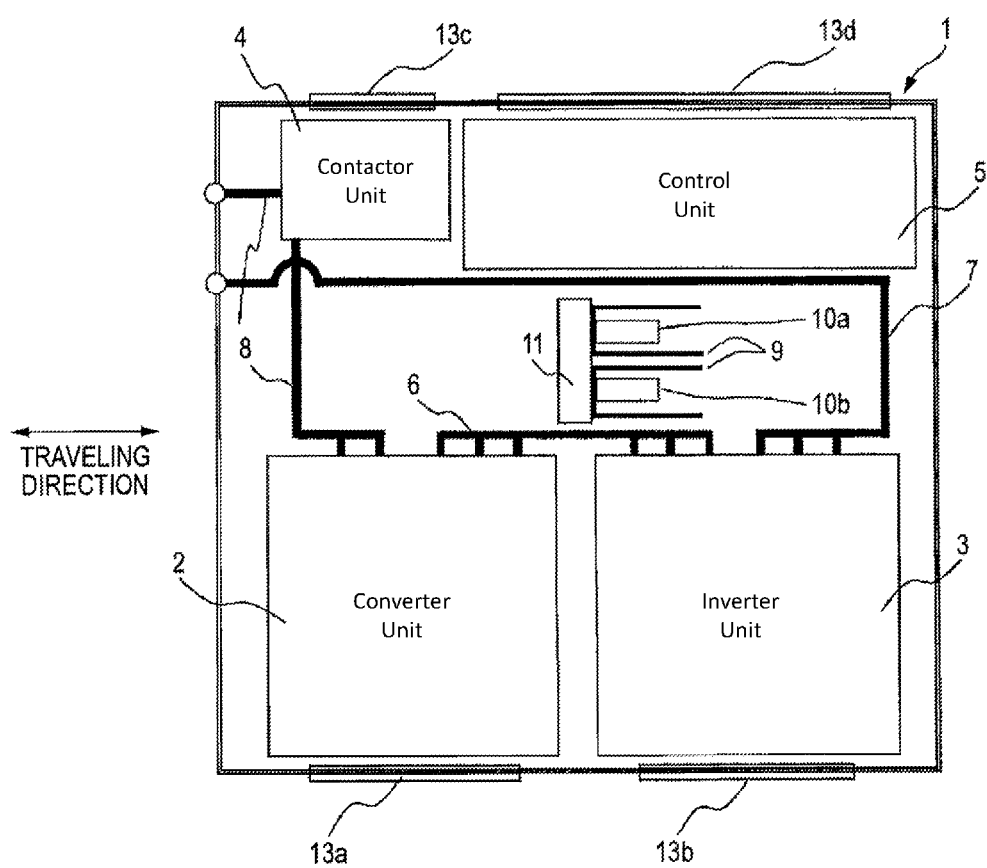
FIG. 2 is an equipment block diagram of an interior of a housing of the power converting device for a vehicle according to the embodiment 1 of the invention, as seen from the top thereof.

FIG. 2 is an equipment block diagram of an interior of a housing of the power converting device for a vehicle 1 according to the embodiment of the invention, as seen from the top thereof. In the interior of the housing of the power converting device 1, the converter unit 2 and the inverter unit 3 are disposed on one side along a traveling direction of the vehicle, and the contactor unit 4 and the control unit 5 are disposed on another side along the traveling direction of the vehicle. Due to the necessity of executing maintenance and inspections frequently, the converter unit 2, the inverter unit 3, the contactor unit 4 and the control unit 5 respectively include access holes 13a to 13d which are provided to the housing, so as to facilitate the maintenance and inspections thereof from a lateral direction of the vehicle.

In many cases, sensors such as the converter current detector 42, the inverter current detectors 43a, 43b, the alternating current detector 44 and the voltage detectors 10a, 10b are accommodated in, for example, an interior of the control unit 5. However, these sensors are less frequently maintained and inspected, and hence, by disposing only sensors requiring frequent maintenance and inspections in the interior of the control unit 5, the control unit 5 can be reduced in size.

In particular, in consideration of the influence of radiation noise by a high-frequency power generated from switching circuits of the converter unit 2 and the inverter unit 3 which are power converters, the voltage detectors 10 needs to be disposed separately in a position which is spaced away from a main circuit wiring (here, a direct current link unit wiring 6) and other wirings which emit radiation noise (in the control unit, for example). Thus, the voltage detectors 10 do not have much degree of freedom in arrangement, which made it difficult to realize a reduction in size of the power converting device in whole.

In this application, however, by disposing shielding units 9 which include a metal such as aluminum between the direct current link unit wiring 6 and the voltage detectors 10 (10a, 10b), where the radiation noise is generated the most, the influence of the radiation noise can be suppressed, and therefore, the voltage detectors 10 can be disposed freely within the housing.

Consequently, the direct current link unit wiring 6 between the converter unit 2 and the inverter unit 3, a motor wiring 7, an alternating current input wiring 8 and the voltage detectors 10a, 10b are disposed in a space defined near a center of the housing between the converter unit 2 and the inverter unit 3, and the contactor unit 4 and the control unit 5 which are disposed on both the sides of the housing along the traveling direction of the vehicle. The voltage detectors 10a, 10b are fixed to a box frame support beam 11 which lies substantially at the center of the power converting device 1 with a bolt or the like. The maintenance and inspection of the voltage detectors 10a, 10b can be executed from an access hole (not shown) provided in a bottom portion of the housing of the power converting device 1.

Figure 3:
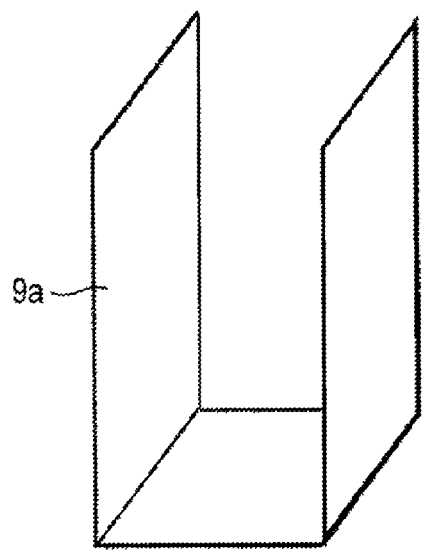
FIG. 3 is a diagram showing a configuration of a shielding unit according to the embodiment 1 of the invention.
Figure 4:
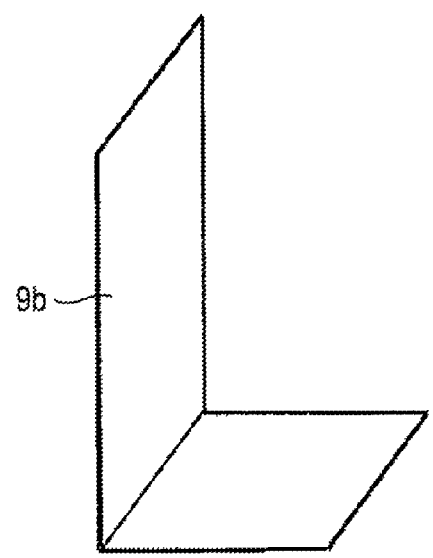
FIG. 4 is a diagram showing another configuration of the shielding unit according to the embodiment 1 of the invention.

FIGS. 3 and 4 show examples of shielding units 9. Shielding units 9 are each made up of a plate containing a metal which includes a surface or surfaces each having an area capable of shielding the corresponding voltage detector 10 from radiation noise from the direct current link unit wiring 6 in accordance with a place where the voltage detector 10 is disposed and a surface on which the shielding unit 9 is fixed to the box frame support beam 11 with a bolt or the like.

Needless to say, the construction of the shielding unit 9 is not limited to those shown in FIGS. 3 and 4. The shielding unit 9 may be constructed otherwise into a box shape which covers a total periphery of the voltage detector 10 or into a shape having a cut in one of sides thereof, in consideration of the suppression effect of influence of radiation noise, easy fixing of itself within the device and specification with respect to limitation on the ambient temperature of the voltage detector 10.

Thus, as has been described above, the power converting device for a vehicle according to the embodiment 1 has the configuration in which the maintenance and inspection of the equipment requiring frequent maintenance and inspection can be executed easily from the sides of the device along the traveling direction of the vehicle by disposing in the housing of the device the converter unit 2 and the inverter unit 3 on the one side along the traveling direction of the vehicle, the contactor unit 4 and the control unit 5 along the other side along the traveling direction of the vehicle, and the direct current link unit wiring 6 and other wirings and the voltage detectors 10a, 10b in the intermediate portion defined between the converter and inverter units 2, 3 and the contactor unit 4 and the control unit 5.

Further, the voltage detectors 10a, 10b can be disposed freely within the housing while being prevented from the influence of radiation noise from the direct current link unit wiring 6 by providing the shielding units 9 between the voltage detectors 10a, 10b and the direct current link unit wiring 6. Accordingly, it is possible to realize a reduction in size of the device by making effect use of the space within the housing.

Figure 5:
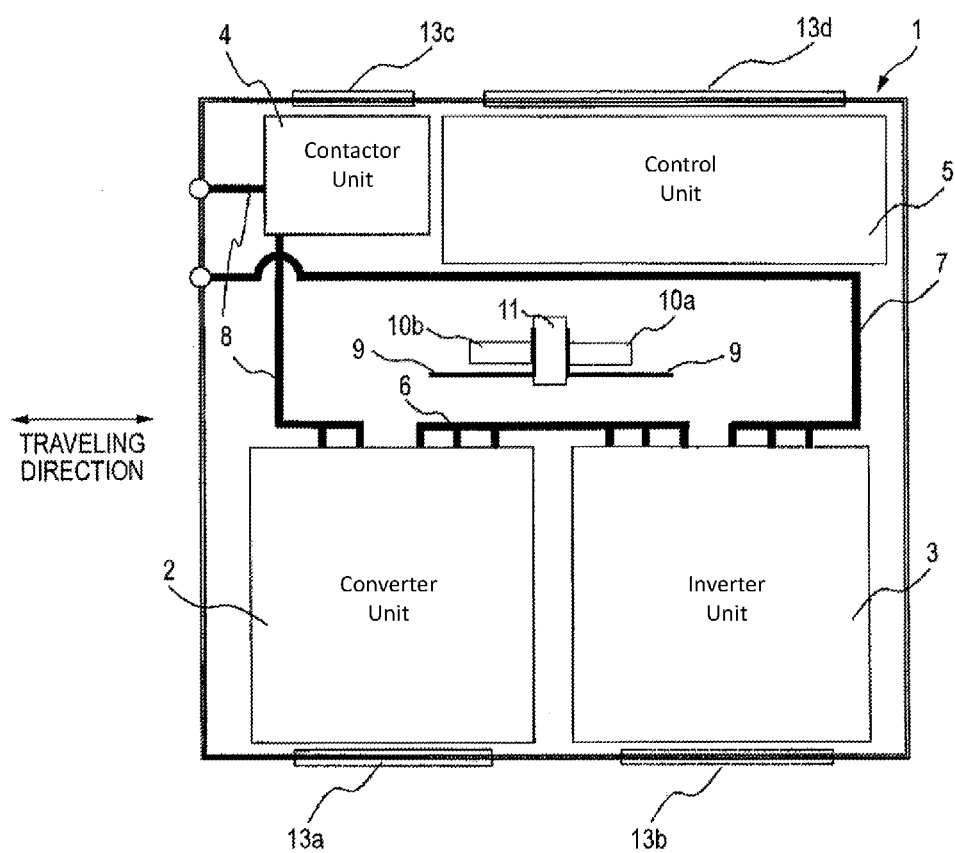
FIG. 5 is another equipment block diagram of the interior of the housing of the power converting device for a vehicle according to the embodiment 1 of the invention, as seen from the top thereof.

The disposition of the voltage detectors 10a, 10b of the embodiment 1 is not limited to that shown in FIG. 2. For example, it is possible to realize a further reduction in size in a width direction of the vehicle by adopting a disposition shown in FIG. 5.

Embodiment 2

Figure 6:
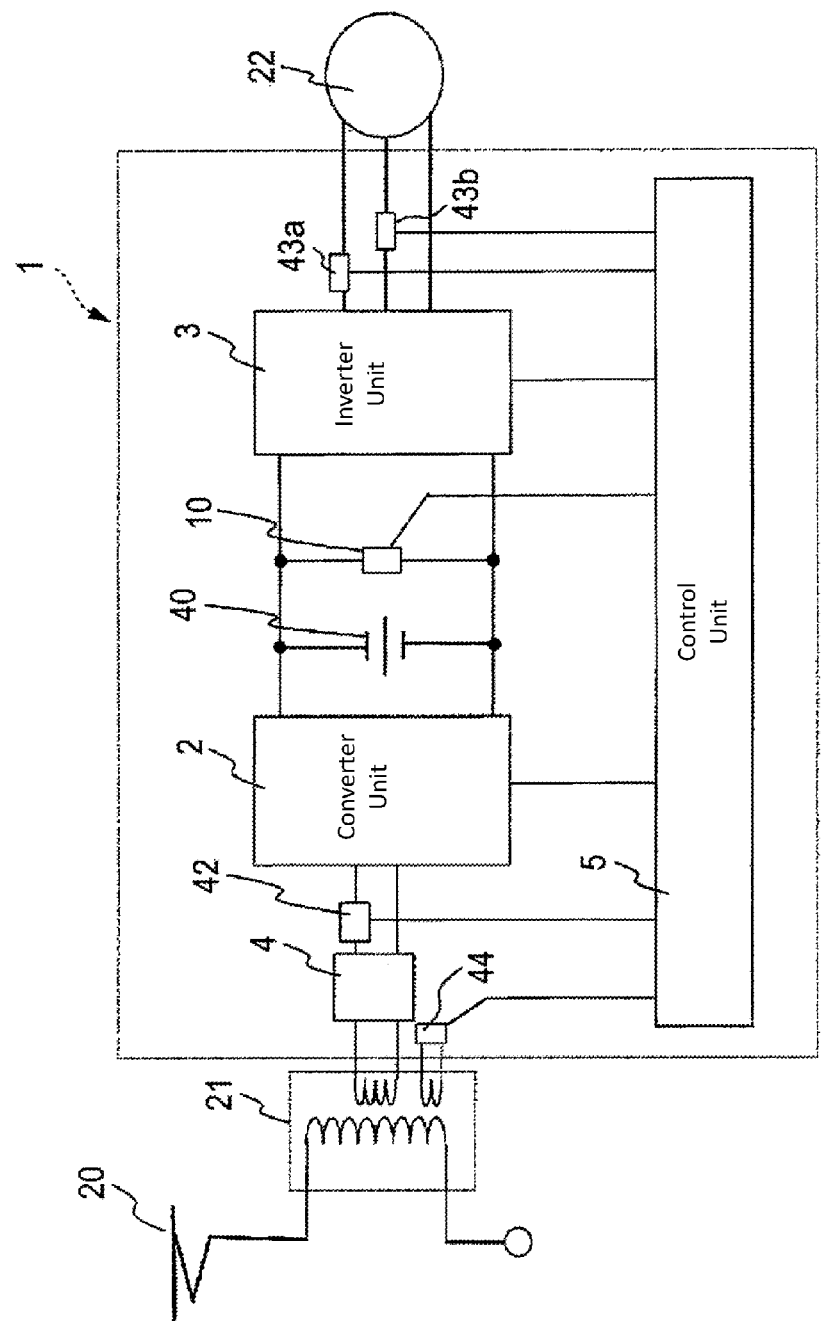
FIG. 6 is a circuit diagram of a power converting device for a vehicle according to embodiment 2 of the invention.

FIG. 6 is a circuit diagram of a power converting device for a vehicle according to embodiment 2 of the invention. The embodiment 2 differs from the embodiment 1 in that it is applied to an electric vehicle with a two-level inverter/converter system. An intermediate direct current voltage has two potentials, and there is only one voltage detector 10 in this portion.

Figure 7:
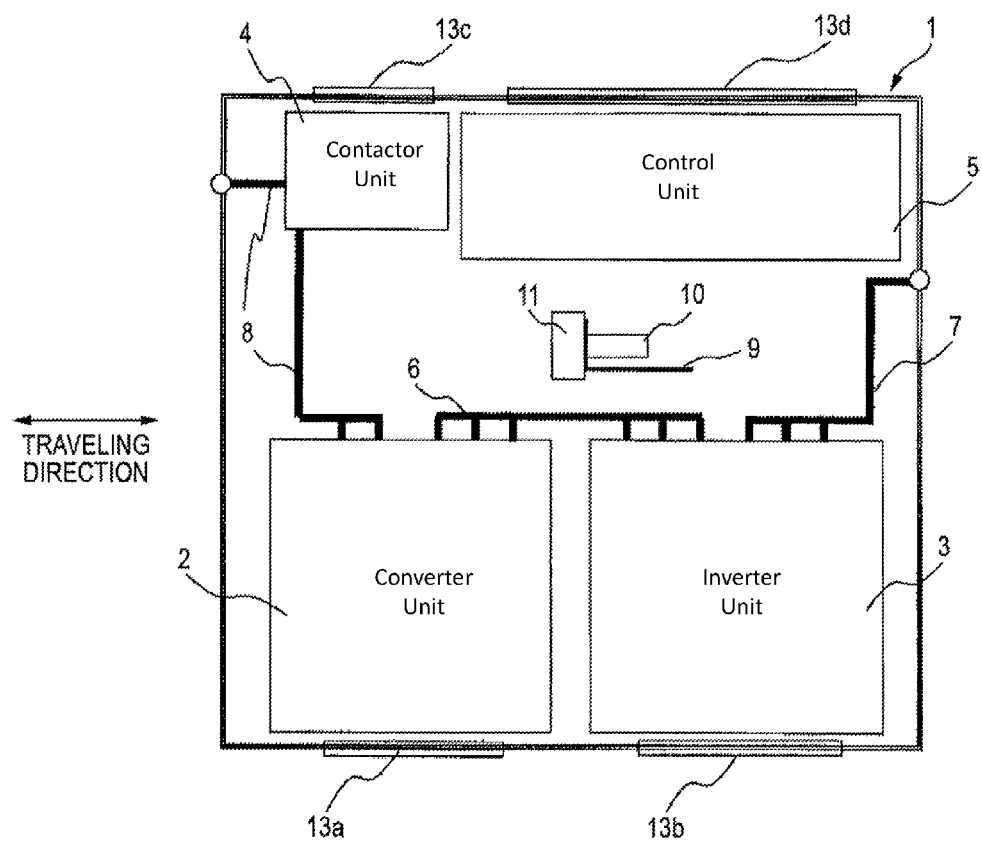
FIG. 7 is an equipment block diagram of an interior of a housing of the power converting device according to the embodiment 2 of the invention, as seen from the top thereof.

FIG. 7 is an equipment block diagram of an interior of a housing of the power converting device according to the embodiment 2 of the invention, as seen from the top thereof. A converter unit 2 and an inverter unit 3, and a contactor unit 4 and a control unit 5 are disposed on both sides of an interior of a housing of a power converting device 1 along a traveling direction of the vehicle. In addition, a direct current link unit wiring 6 between the converter unit 2 and the inverter unit 3 and a motor wiring 7, an alternating current input wiring 8 and a voltage detector 10 are disposed in a space defined near a center of the housing between the converter unit 2 and the inverter unit 3, and the contactor unit 4 and the control unit 5. This voltage detector 10 is fixed to a box frame support beam 11 which lies substantially at the center of the power converting device 1 with, for example, a bolt. The maintenance and inspection of the voltage detector 10 can be executed from an access hole (not shown) provided in a bottom portion of the housing of the power converting device 1.

The voltage detector 10 has an L-shaped shielding unit 9 which can shield the radiation noise from the direct current link unit wiring 6, so as to suppress the influence of radiation noise. The shape of the shielding unit 9 and the disposition of the voltage detector are not limited to those illustrated.

Embodiment 3

Figure 8:
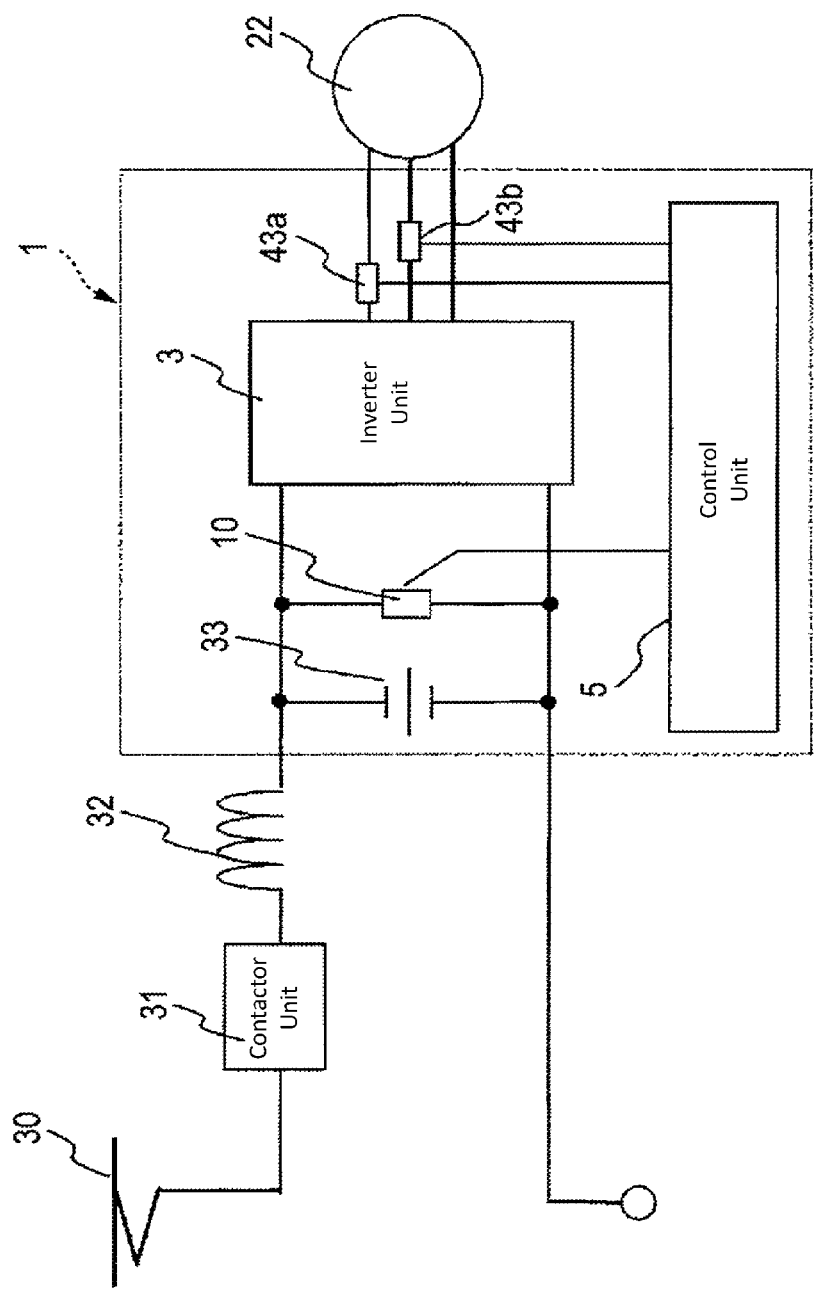
FIG. 8 is a circuit diagram of a power converting device for a vehicle according to embodiment 3 of the invention.

FIG. 8 is a circuit diagram of a power converting device for a vehicle according to embodiment 3 of the invention. The embodiment 3 differs from embodiment 1 in that it is applied to an electric vehicle with a two-level inverter system which runs in a direct current feeding section. A direct current voltage obtained from a direct current overhead wire 30 via a pantograph or the like is connected to an input filter reactor unit 32 and an input filter condenser unit 33 via a contactor unit 31.

Accordingly, the direct current voltage from the direct current power supply 30 is smoothed to be supplied to the inverter unit 3, and a harmonic current generated by a power converting operation at the inverter unit 3 suppresses the influence on the direct current power supply 30. At the inverter unit 3, the smoothed direct current voltage is converted into a three-phase alternating current which is variable in voltage and variable in frequency. The three-phase alternating current is outputted to an electric motor 22 to drive the electric motor 22.

Figure 9:
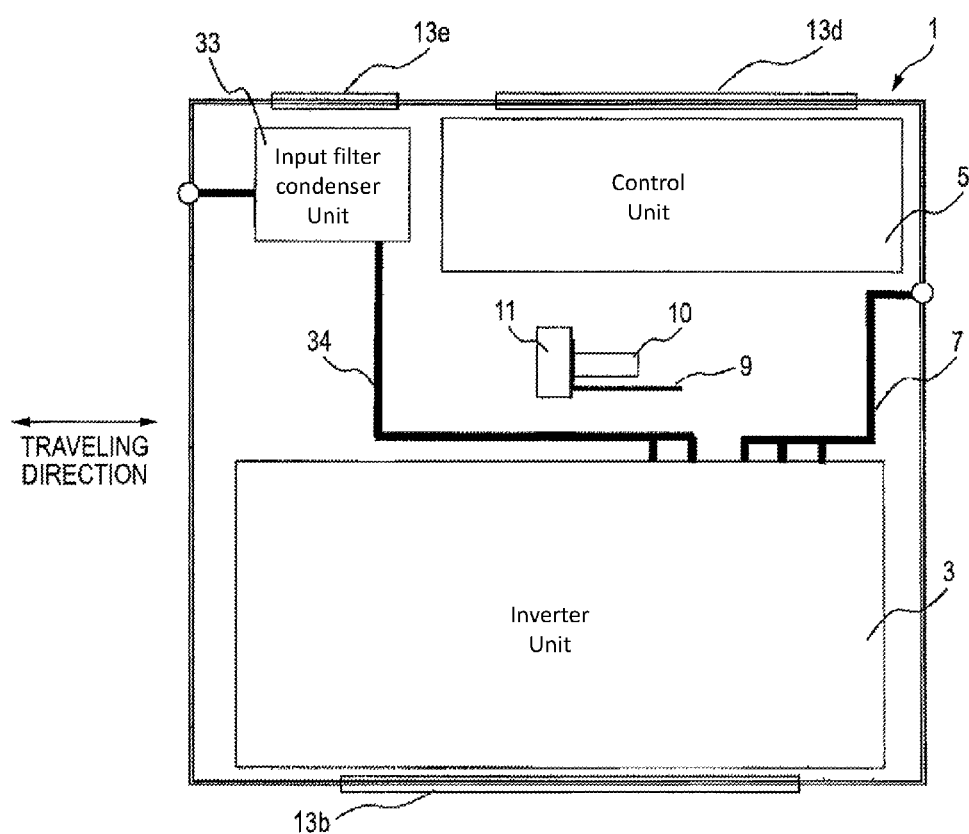
FIG. 9 is an equipment block diagram of an interior of a housing of the power converting device according to the embodiment 3 of the invention, as seen from the top thereof.

FIG. 9 is an equipment block diagram of an interior of a housing of the power converting device according to the embodiment 3 of the invention, as seen from the top thereof. A direct current bus wiring 34 between the input filter condenser 33 and a control unit 5 and a motor wiring 7 and a voltage detector 10 are disposed in a space defined near a center of the housing between the input filter condenser 33 and the control unit 5. This voltage detector 10 is fixed to a box frame support beam 11 which lies substantially at the center of the power converting device 1 with a bolt or the like. The maintenance and inspection of the voltage detector 10 can be executed from an access hole (not shown) provided in a bottom portion of the housing of the power converting device 1.

Due to the necessity of executing maintenance and inspections frequently, the inverter unit 3, the input filter condenser 33 and the control unit 5 respectively include access holes 13b, 13c, 13e which are provided to the housing, so as to facilitate the maintenance and inspections thereof from a lateral direction of the vehicle so as to facilitate the maintenance and inspections thereof from a lateral direction of the vehicle.

The voltage detector 10 has an L-shaped shielding unit 9 which can shield the radiation noise from the direct current bus wiring 34, so as to suppress the influence of radiation noise from a main circuit wiring (here, the direct current bus wiring 34). The shape of the shielding unit 9 and the disposition of the voltage detector 10 are not limited to those illustrated.

As described above, in the embodiments of this application, the converter unit 2, the inverter unit 3, the contactor unit 4, the control unit 5 and the input filter condenser unit 33, which require frequent maintenance and inspections, are disposed on both sides of the interior of the housing of the power converting device along the traveling direction of the vehicle, and the respective wirings and the voltage detector or detectors 10 are disposed in the space defined near the center of the housing between those constituent components. Accordingly, the power converting device is configured such that the constituent components can easily be subjected to maintenance and inspection from the sides of the vehicle.

Further, the influence of radiation noise is suppressed by providing the shielding unit 9 between the voltage detector 10 and the main circuit wiring, whereby the voltage detector 10 can freely be disposed in the interior of the housing of the power converting device. Accordingly, a reduction in size of the power converting device is realized by making effective use of the space within the housing.

In the embodiments described above, while the voltage detector or detectors 10 are disposed in the space defined at the center of the housing, the other sensors can also be disposed similarly. Accordingly, there is an advantage that the components can be freely be disposed, so as to realize reduction in size in response to various design requirements.

The invention claimed is:

1. A control device for a vehicle, the control device comprising, in a housing that is installed under a floor of the vehicle:
   a power converter configured of a semiconductor switching circuit;
   a control unit that controls an output of the power converter so as to supply a required power to a load;
   a wiring that is connected to the power converter;
   a voltage detector that detects a voltage applied to the wiring and outputs the detected voltage to the control unit; and
   a shielding unit that shields radiation noise from the wiring to the voltage detector,
   wherein the shielding unit is configured of a plate containing metal, which includes a surface having area capable of shielding radiation noise from the wiring,
   wherein the control unit is disposed on a first exterior side of the housing along a traveling direction of the vehicle, the power converter is disposed on a second exterior side of the housing along the traveling direction of the vehicle and the voltage detector is disposed in the interior of the housing between the power converter and the control unit and spaced from the power converter and the control unit at a direction perpendicular to the traveling direction of the vehicle.
   wherein a first access hole is provided to the first exterior side of the housing, and
   wherein a second access hole is provided to the second exterior side of the housing.

2. A control device for a vehicle according to claim 1, wherein the control unit that includes a first access hole and a contactor unit that includes a third access hole are disposed at the first exterior side of the housing, and
   wherein the power converter that includes a second access hole is disposed at the second exterior side of the housing.

3. A control device for a vehicle according to claim 1, wherein a first access hole for inspecting the control unit and a third access hole for inspecting a contactor unit are provided to the first exterior side of the housing, and
   wherein a second access hole for inspecting the power converter is provided to the second exterior side of the housing.

4. A control device for a vehicle according to claim 1, wherein the control unit that includes a first access hole and an input filter condenser unit that includes a third access hole are disposed at the first exterior side of the housing, and
   wherein the power converter that includes a second access hole is disposed at the second exterior side of the housing.

5. A control device for a vehicle according to claim 1, wherein a first access hole for inspecting the control unit and a third access hole for inspecting an input filter condenser unit are provided to the first exterior side of the housing, and
   wherein a second access hole for inspecting the power converter is provided to the second exterior side of the housing.

6. A control device for a vehicle according to claim 1, wherein the power converter is configured of an inverter unit and a converter unit,
   wherein the control unit that includes a first access hole and a contactor unit that includes a third access hole are disposed at the first exterior side of the housing, and
   wherein the inverter unit that includes a fourth access hole and the converter unit that includes a second access hole are disposed at the second exterior side of the housing.

7. A control device for a vehicle according to claim 1, wherein the power converter is configured of an inverter unit and a converter unit,
   wherein a first access hole for inspecting the control unit and a third access hole for inspecting a contactor unit are provided to the first exterior side of the housing, and
   wherein a fourth access hole for inspecting the inverter unit and a second access hole for inspecting the converter unit are provided to the second exterior side of the housing.

8. A control device for a vehicle according to claim 1, wherein a plurality of the voltage detectors each has a shielding unit and are disposed so as to be aligned in a direction perpendicular to the traveling direction of the vehicle.

9. A control device for a vehicle according to claim 1, wherein a plurality of the voltage detectors each has a shielding unit and are disposed so as to be aligned in a direction parallel to the traveling direction of the vehicle.

10. A control device for a vehicle, the control device comprising:
    a housing installed under a floor of the vehicle;
    a power converter including a semiconductor switching circuit;
    a control unit that controls output of the power converter;
    a wiring that is connected to the power converter;
    a voltage detector that detects a voltage applied to the wiring and outputs the detected voltage to the control unit; and
    a shielding unit that shields radiation noise from the wiring to the voltage detector,
    wherein the shielding unit is configured of a plate containing metal, which includes a surface having a surface area capable of shielding radiation noise from the wiring,
    wherein the power converter, the control unit, the wiring and the voltage detector are provided to the housing,
    wherein the control unit is disposed on a first exterior side of the housing along a traveling direction of the vehicle, the power converter is disposed on a second exterior side of the housing along the traveling direction of the vehicle, and the voltage detector is disposed in the interior of the housing between the power converter and the control unit and spaced from the power converter and the control unit at a direction perpendicular to the traveling direction of the vehicle,
    wherein a first access hole is provided to the first exterior side of the housing, and
    wherein a second access hold is provided to the second exterior side of the housing.

* * * * *